(12) United States Patent
Suryagandh et al.

(10) Patent No.: US 7,610,160 B2
(45) Date of Patent: Oct. 27, 2009

(54) INTEGRATED CIRCUIT TESTER INFORMATION PROCESSING SYSTEM

(75) Inventors: Sushant S. Suryagandh, Sunnyvale, CA (US); Judy Xilin An, Saratoga, CA (US)

(73) Assignee: GlobalFoundries Inc., Grand Cayman (KY)

( * ) Notice: Subject to any disclaimer, the term of this patent is extended or adjusted under 35 U.S.C. 154(b) by 262 days.

(21) Appl. No.: 11/857,272

(22) Filed: Sep. 18, 2007

(65) Prior Publication Data

US 2009/0076750 A1 Mar. 19, 2009

(51) Int. Cl.
*G06F 19/00* (2006.01)

(52) U.S. Cl. .......................... 702/64; 257/274
(58) Field of Classification Search ............ 702/64, 702/65, 67, 76, 77, 182–185, 188; 703/14; 438/1; 257/274
See application file for complete search history.

(56) References Cited

U.S. PATENT DOCUMENTS 7,101,744 B1 9/2006 Dyer et al.
2004/0149045 A1 8/2004 Johnson et al.
2007/0028195 A1 2/2007 Chidambarrao et al.
2009/0099829 A1* 4/2009 Topaloglu et al. ............. 703/14
2009/0113368 A1* 4/2009 Lin et al. ...................... 716/10

OTHER PUBLICATIONS

C.D. Sheraw et al., Dual Stress Liner Enhancement in Hybrid Orientation Technology, 2005 Symposium on VLSI Technology Digest of Technical Papers, pp. 12-13.

* cited by examiner

*Primary Examiner*—Edward Raymond
(74) *Attorney, Agent, or Firm*—Farjami & Farjami LLP

(57) ABSTRACT

A method for operating an integrated circuit tester information processing system includes measuring current information from test structures for an integrated circuit having dual stress liners; selecting currents from the current information or stored current information; deriving a scaling factor with the currents for a stress contribution based on an active area of a circuit element in the integrated circuit; and correlating the stress contribution with the integrated circuit.

20 Claims, 10 Drawing Sheets

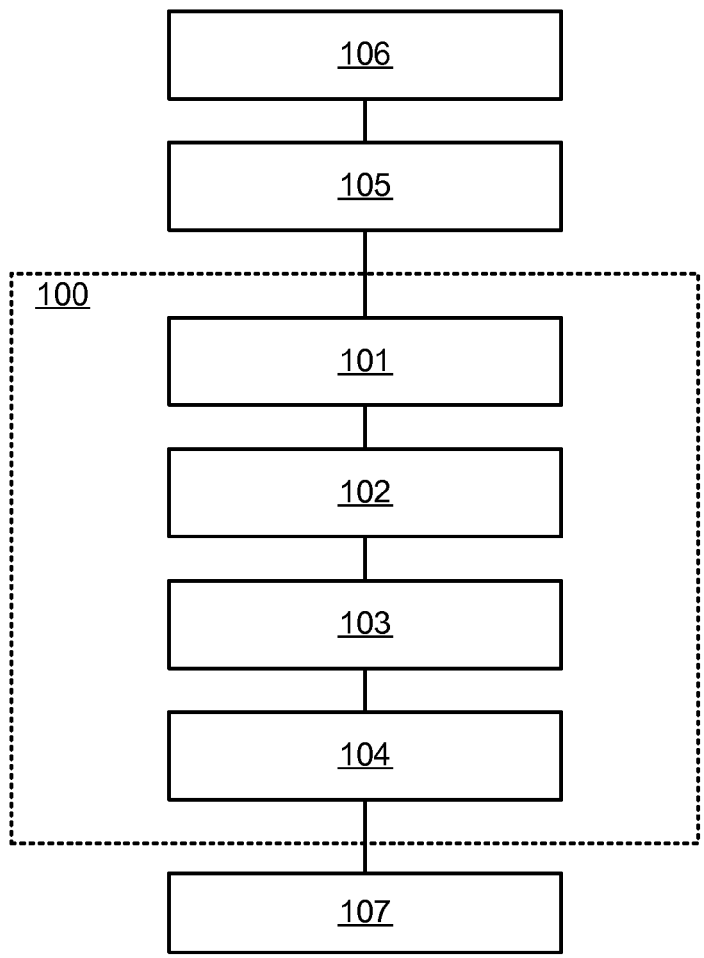
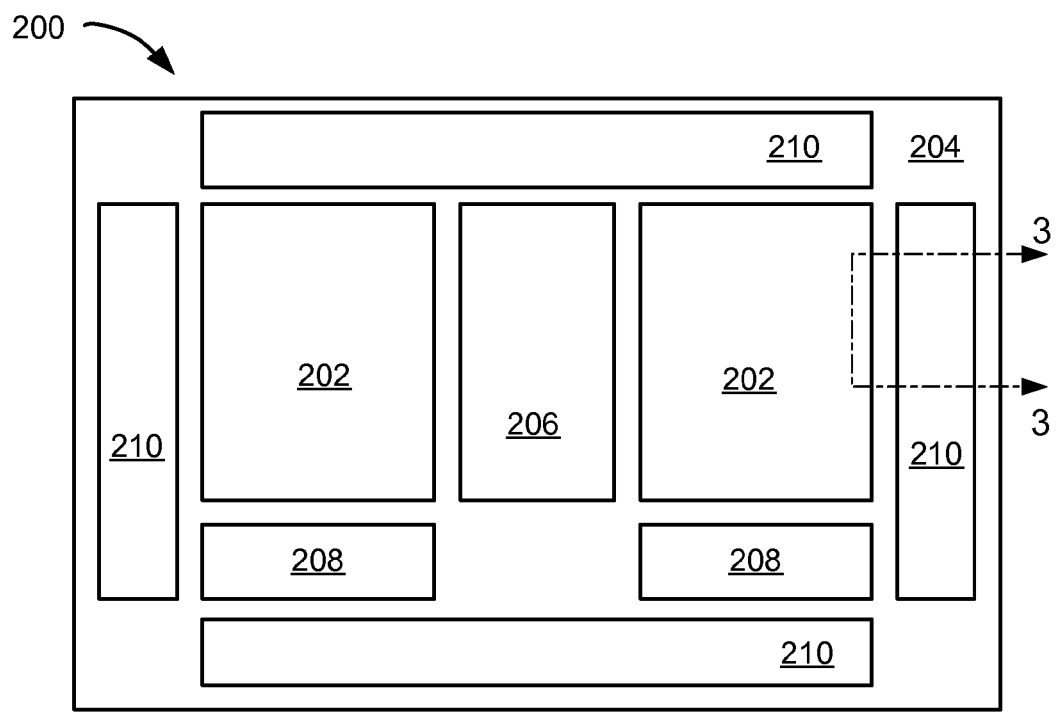

INTEGRATED CIRCUIT TESTER INFORMATION PROCESSING SYSTEM

TECHNICAL FIELD

The present invention relates generally to integrated circuit technology and more specifically to integrated circuit research and development.

BACKGROUND ART

Modern electronics, such as smart phones, personal digital assistants, location based services devices, digital cameras, music players, servers, and storage arrays, are packing more integrated circuits into an ever-shrinking physical space with expectations for decreasing cost. Both higher performance and lower power are also quintessential requirements for electronics to continue proliferation into everyday life. For example, more functions are packed into a cellular phone with higher performance and longer battery life. Numerous technologies have been developed to meet these requirements.

Integrated circuits are often manufactured in and on silicon and other integrated circuit wafers. Integrated circuits include literally millions of metal oxide semiconductor field effect transistors (MOSFET). Advances in integrated circuit technology continue to shrink the sizes of these transistors and drive for higher performance with minimum power consumption. This dichotomy has inspired various approaches to solve the need for speed at lower power.

One approach involves continued shrinkage of key features of the integrated circuit technology. This approach provides a size reduction but continues to struggle balancing cost, performance, and power. Another approach involves different integrated circuit materials or material systems, such as silicon on insulator (SOI), silicon germanium (SiGe) material, etc. These alternatives provide some technology improvements but are not mainstream today resulting in higher cost as well as constrain volume capacity.

Yet another approach is to provide performance improvement and power reduction while controlling cost. This approach squeezes as much performance, power, or both out of a given integrated circuit technology and manufacturing through a technique called "strained" transistors. This allows use of existing integrated circuit manufacturing and technology investments to keep the cost down or extend future technology generations.

There are various strained integrated circuit approaches. Some approaches use different material systems as the SOI mentioned earlier. Again, these different material systems provide technology improvements but add cost and are not available in volume to satisfy the high volume modern electronics needs. Other "strained" approaches use mainstream integrated circuit technology and manufacturing, such as complementary metal oxide semiconductor (CMOS).

One area where the paradox of performance, power, and cost is most evident in the modern Ultra-Large Scale Integration era is in the microprocessor. The microprocessor in one form or another permeates modern electronics. Microprocessor applications need faster transistor speeds and high drive currents. Microprocessor integrated circuit technologies have seen many transistor designs and processing schemes to improve the mobility of carriers to improve performance and lower power consumption. One way to achieve faster switching of a MOS transistor is to design the device with "strained" transistors so that the mobility and velocity of its charge carriers in the channel region are increased.

An appropriate type of stress in the channel region of an n-channel metal oxide semiconductor (NMOS) transistor is known to improve carrier mobility and velocity, which results in increased drive current for the transistor. High tensile material such as silicon nitride supplies a tensile stress in the NMOS region beneath the tensile layer.

To achieve performance improvement and power reduction in a CMOS device, both the PMOS transistor and the NMOS transistor need to be strained. The PMOS transistor must be strained to provide compression stress to the p-channel while the NMOS transistor must be strained to provide tensile stress to the n-channel. Typically, dual stress liners (DSL) may be used to accommodate the different stress requirements.

The DSL technique has complicated process and integration issues, such as counteracting stress forces between opposite stress layers affecting the stress applied. These counteracting stresses may reduce the effectiveness and reliability of the integrated circuits. Thus, accurate models of the effects of the stress layers over the strained transistors as well as the transistors at the opposite stress region are essential for reliable, high volume manufacturing of integrated circuits utilizing stress liners. However, competitive time to volume pressures and the drive for profitability constrain the analysis, such as gathering test data and simulation time, of this important subject.

Thus, a need still remains for a system that will allow integrated circuit designers to predict the impact of stress interactions on their design prior to manufacture. The demand for highly reliable and long life products make it is increasingly critical that answers be found to these problems. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for operating an integrated circuit tester information processing system including: measuring current information from test structures for an integrated circuit having dual stress liners; selecting currents from the current information or stored current information; deriving a scaling factor with the currents for a stress contribution based on an active area of a circuit element in the integrated circuit; and correlating the stress contribution with the integrated circuit.

Certain embodiments of the invention have other aspects in addition to or in place of those mentioned or obvious from the above. The aspects will become apparent to those skilled in the art from a reading of the following detailed description when taken with reference to the accompanying drawings.

BRIEF DESCRIPTION OF THE DRAWINGS

FIG. 1 shows a block diagram of an integrated tester information processing system in an embodiment of the present invention;

FIG. 2 is a plan view of an integrated circuit in an embodiment of the present invention;

BEST MODE FOR CARRYING OUT THE INVENTION

Figure 3:
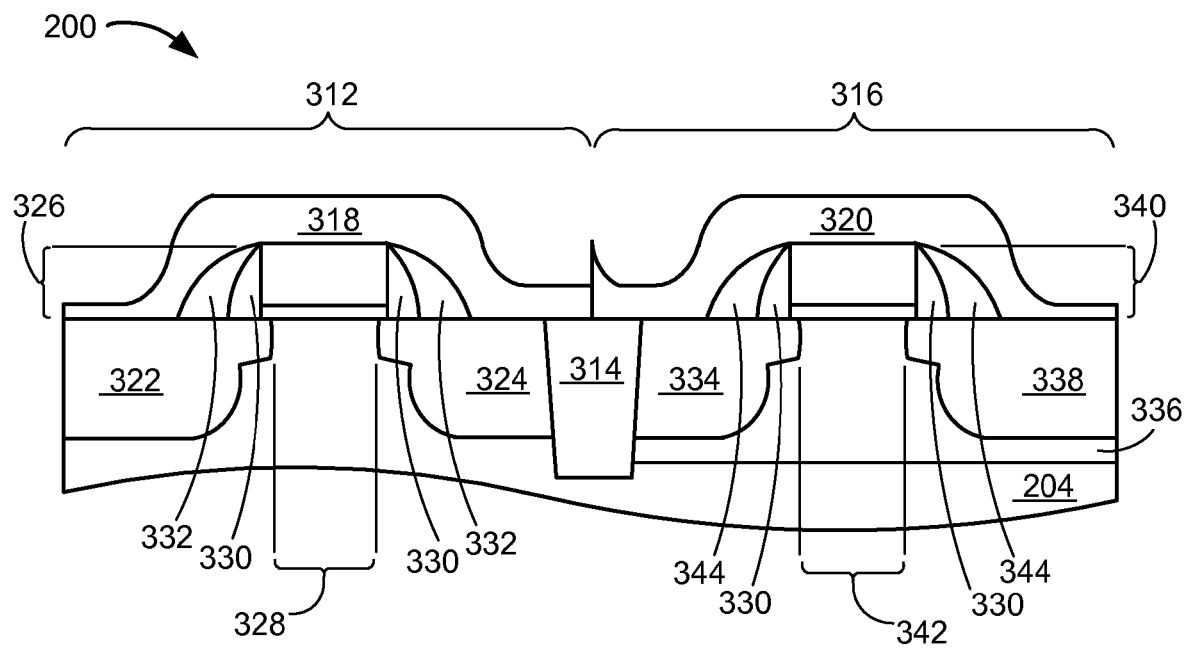
FIG. 3 is a cross-sectional view of a portion of the integrated circuit along 3-3 of FIG. 2.

In the following description, numerous specific details are given to provide a thorough understanding of the invention. However, it will be apparent that the invention may be practiced without these specific details. In order to avoid obscuring the present invention, some well-known circuits, package configurations, and process steps are not disclosed in detail.

Likewise, the drawings showing embodiments of the apparatus are semi-diagrammatic and not to scale and, particularly, some of the dimensions are for the clarity of presentation and are shown greatly exaggerated in the drawing FIGs.

Similarly, although the block views in the drawings for ease of description show the invention with process flow as oriented downward, this arrangement in the figures is arbitrary and is not intended to suggest that invention should necessarily be in a downward direction. Generally, the apparatus can be operated in any direction. The same numbers are used in all the drawing figures to relate to the same elements.

The term "horizontal" as used herein is defined as a plane parallel to the conventional plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

Referring now to FIG. 1, therein is shown a block diagram of an integrated circuit tester information processing system 100 according to the present invention. The integrated circuit tester information processing system 100 is the result of the discovery that at times a single fundamental block can solve the problems presented but often there are four fundamental blocks to solving the problems presented.

The four fundamental blocks are a generation block 101, an extraction block 102, an analysis block 103, and a presentation block 104. Each of the blocks can stand independently in the integrated circuit tester information processing system 100, and within these blocks are various commercially available techniques, methodologies, processes, circuitry, and approaches as well as the invention disclosed herein. The four fundamental blocks are discussed in the approximate chronology that the blocks are used in the integrated circuit tester information processing system 100. The goal of the four fundamental blocks is the support of a production block 107.

The integrated circuit tester information processing system 100 includes various pieces of commercially available production, test, research, and development semiconductor equipment, which operate on and manipulate information and/or data, which are generically defined herein as "information". The integrated circuit tester information processing system 100 receives information from a tester 105, which is connected to a system-under-test 106.

The tester 105 may be any number of test systems, such as a semiconductor test equipment for testing wafers or die, test bench instrumentations, compute devices, system diagnostic boards and firmware, circuitry, or any combination thereof. The interface from the tester 105 to the system-under-test 106 may be any number interconnects, such as wires, wireless, direct connections, or network connections.

The system-under-test 106 may be a complete wafer, an integrated circuit die, packaged integrated circuit, system boards with integrated circuits, or a combination thereof. The system-under test 106 may be mounted on any number of structures, such as a wafer carrier, a semiconductor test equipment board, a test bench board, or a system board.

In the generation block 101, information is generated looking at new and old integrated circuit products, new and old processes, product and process problems, unexpected or unpredictable results and variations, etc. Generation of the information may be obtained in any number of ways, such as utilizing the tester 105 to retrieve information from the system-under-test 106, stored test information, a compute device, or information over a network. It may also require new equipment and/or methods, which are described herein when required.

The generation block 101 may generate a number of information types for the integrated circuit, such as an amount of electric current or voltage levels. The generated information may be gathered from any part of the system-under-test 106, such as from the entire wafer, the entire integrated circuit, a portion of the integrated circuit, or a test structure.

As wafer utilization and size increase, the amount of test information generated increases requiring more time for the system-under-test 106, the tester 105, and personnel. The additional time increases cost and decreases throughput. The generation block 101 may be implemented in any number of ways, such as with software or circuitry.

In the extraction block 102, usable information is extracted from the generated information from the generation block 101. Essentially, the generated information is translated into more useful forms; e.g., broken apart so it can be reassembled in different forms to show different inter-relationships.

For example, most testing equipment provides raw data in massive test files. Sometimes, millions of measurements provide millions of pieces of information, which must be digested and understood. The test files seldom have user-friendly tabular and/or graphical outputs of parameters and values of interest. Even where somewhat user-friendly outputs are provided, there are problems with the proper schema for storing the usable data and for formatting the data for subsequent analysis.

Extraction of the usable information may also require new equipment and/or methods. Sometimes, extraction includes storing the information for long duration experiments or for different experiments, which are described herein when required.

The extraction block 102 for integrated circuits may include extracting the appropriate information, such as the amount of electric current or voltage levels, from the generation block 101. The extraction block 102 may extract current or past information of various categories, such as between wafer lines, in a wafer line, at a wafer level, of an entire integrated circuit, a part of an integrated circuit, a test structure, from past data, from process data, or for reliability information. The extraction block 102 may be implemented in any number of ways, such as with software or circuitry.

In the analysis block 103, the usable information from the extraction block 102 is analyzed. Unlike previous systems where a few experiments were performed and/or a relatively few data points determined, the sheer volume of experiments and data precludes easy analysis of trends in the data or the ability to make predictions based on the data. Analysis of the extracted information may also require new equipment and/or methods, which are described herein when required.

As wafer utilization and size increase, the amount of reliability and test information increases. The analysis block 103 may utilize representative portions of the information from the extraction block 102 and perform operations balancing the need to provide the reliable representative analysis results while minimizing the amount of information needed for analysis. The analysis block 103 may be implemented in any number of ways, such as with software or circuitry. For illustrative purposes, the analysis block 103 may utilize a portion of an integrated circuit, test structures, or modeling of an equivalence-based integrated circuit from the extracted data.

In the presentation block 104, the analyzed information from the analysis block 103 is manipulated and presented in a comprehensible form to assist others in understanding the significance of the analyzed data. The huge amount of analyzed information often leads to esoteric presentations, which are not useful per se, misleading, or boring. Proper presentation often is an essential ingredient for making informed decisions on how to proceed to achieve yield and processing improvements. The presentation block 104 may be implemented in any number of ways, such as with software or circuitry. In some cases, problems cannot even be recognized unless the information is presented in an easily understood and digested form, and this often requires new methods of presentation, which are described herein when required.

The presentation block 104 for the integrated circuit may present the extracted data and the analysis in any number of ways, such as comparing integrated circuit or wafer information and comparing fit with the selected portions or test structures. Correlation information may be presented to validate integrated circuit architecture as well as analysis fit.

Referring now to FIG. 2, therein is shown a plan view of an integrated circuit 200 in an embodiment of the present invention. The plan view depicts an example of the integrated circuit 200 including memory systems 202 in a substrate 204, such as a semiconductor substrate, wherein the substrate 204 may include one or more high-density core regions and one or more low-density peripheral portions are formed.

High-density core regions typically include one or more of the memory systems 202. Low-density peripheral portions typically include peripheral circuitry 210, such as input/output (I/O) circuitry or transistors interfacing to the memory systems 202, and programming circuitry for individually and selectively addressing a location in each of the memory systems 202.

The programming circuitry is represented in part by and includes one or more x-decoders 206 and y-decoders 208, cooperating with the peripheral circuitry 210 for connecting the source, gate, and drain of selected addressed memory cells to predetermined voltages or impedances to effect designated operations on the memory cell, e.g. programming, reading, and erasing, and deriving necessary voltages to effect such operations. For illustrative purposes, the integrated circuit 200 is shown as a memory device, although it is understood that the integrated circuit 200 may include other semiconductor devices having other functional blocks, such as a digital logic block, a processor, or other types of memories.

Referring now to FIG. 3, therein is shown a cross-sectional view of a portion of the integrated circuit 200 along 3-3 of FIG. 2. The integrated circuit 200 includes the substrate 204, such as a p-type substrate, having a first circuit element 312, an isolation region 314, a second circuit element 316, a first stress formation liner 318, such as a tensile layer of nitride or silicon nitride, and a second stress formation liner 320, such as a compression layer of nitride or silicon nitride. The first stress formation liner 318 is preferably over the first circuit element 312. The second stress formation liner 320 is preferably over the second circuit element 316.

The first circuit element 312, such as an n-type metal oxide semiconductor (NMOS) transistor, includes a first source 322, such as an n-type source, formed in the substrate 204. A first drain 324, such as an n-type drain, is formed in the substrate 204.

A first gate stack 326 is over the substrate 204 and over a first channel region 328. The first channel region 328 is in the substrate 204 and between the first source 322 and the first drain 324. An oxide liner 330 may be formed adjacent to the first gate stack 326 over the first source 322 and the first drain 324. A first spacer 332 is preferably formed over the oxide liner 330 surrounding the first gate stack 326 as well as over the first source 322 and the first drain 324.

The second circuit element 316, such as a p-type metal oxide semiconductor (PMOS) transistor, includes a second source 334 formed in a well region 336, such as an n-type well. The well region 336 is in the substrate 204. A second drain 338 is formed in the well region 336.

A second gate stack 340 is preferably formed over the substrate 204 and over a second channel region 342. The second channel region 342 is in the well region 336 located between the second source 334 and the second drain 338.

The oxide liner 330 is formed adjacent to the second gate stack 340 over the second source 334 and the second drain 338. A second spacer 344 is formed on the oxide liner 330 surrounding the second gate stack 340 as well as over the second source 334 and the second drain 338.

As an example, the first stress formation liner 318 over the first circuit element 312 provides tensile stress to the first channel region 328. This tensile stress strains the first channel region 328 to increase electron mobility thereby increasing performance, lowering power consumption, or a combination thereof of the first circuit element 312.

Continuing with the example, the second stress formation liner 320 over the second circuit element 316 provides compression stress to the second channel region 342. This compression stress strains the second channel region 342 to increase hole mobility thereby increasing performance, lowering power consumption, or a combination thereof of the second circuit element 316.

The strain induced at the first circuit element 312 and the second circuit element 316 may not be limited to the stressed from the first stress formation liner 318 and the second stress formation liner 320, respectively. For example, the first stress formation liner 318 may also affect the strain at the second circuit element 316. The second stress formation liner 320, as an example, may also affect the strain at the first circuit element 312.

Proximity of opposite type of stress liners, such as the first stress formation liner 318 and the second stress formation liner 320, can change the circuit element carrier effective mass properties depending on the distance of that opposite layer. For example in the second circuit element 316, compressive stress increases the hole mobility and makes the second circuit element 316 faster. Tensile stress in parallel direction (current direction) reduces hole mobility at the second circuit element 316. However, tensile stress in orthogonal direction (perpendicular to the current direction) increases hole mobility at the second circuit element 316. The mobility increase and decrease are functions of distances of the stress source from the second circuit element 316.

The present invention provides equations for orthogonal and parallel directions for both NMOS and PMOS devices. The present invention further provides these equations and relationships in the compact model without the use of any other tools such as timing computer aided design (TCAD) modeling.

Figure 4:
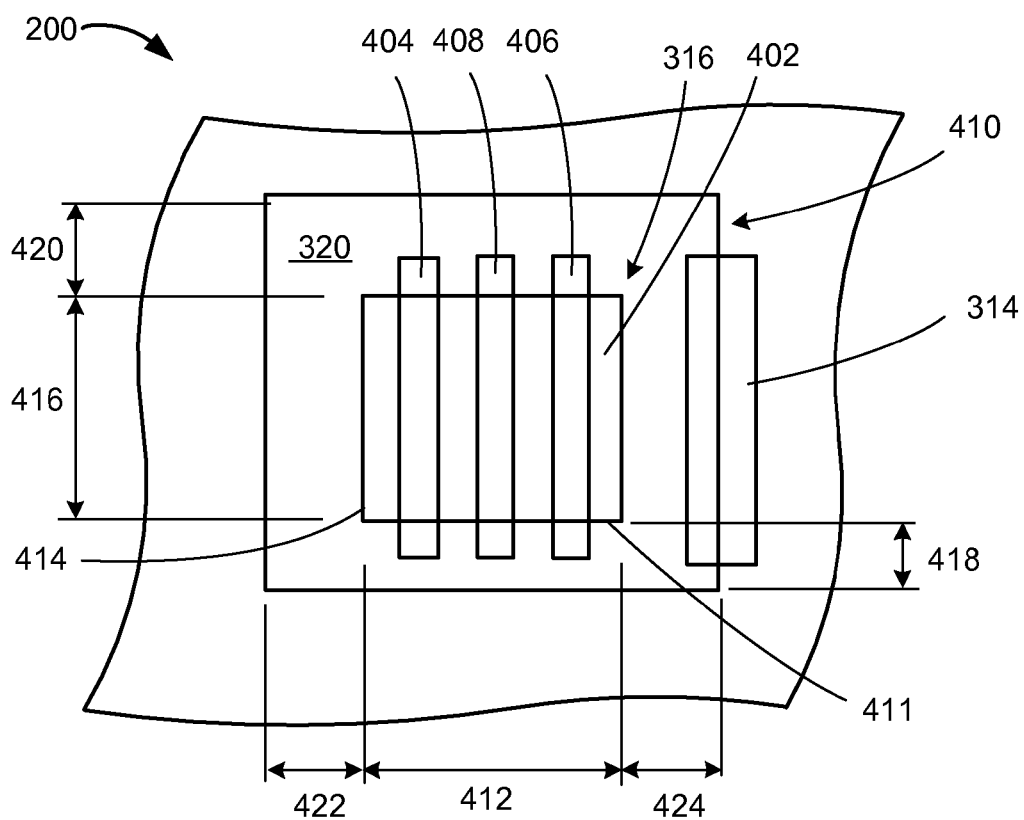
FIG. 4 is a more detailed plan view of a portion of the integrated circuit of FIG. 3.

Referring now to FIG. 4, therein is shown a more detailed plan view of a portion of the integrated circuit 200 of FIG. 3. As an example, the plan view depicts the second circuit element 316 or the PMOS transistor, although it is understood that the following discussion may be appropriately applied to the first circuit element 312 of FIG. 3 with the first stress formation liner 318 of FIG. 3.

The second circuit element 316, also referred to as the device of interest or the victim device, includes an active area 402. The active area 402 preferably includes the second source 334 of FIG. 3 and the second drain 338 of FIG. 3 under a first poly line 404 and a second poly line 406, respectively. A gate line 408 is also over the active area 402 between the first poly line 404 and the second poly line 406, wherein the gate line 408 is coupled to the second gate stack 340 of FIG. 3. The second stress formation liner 320 is preferably over the active area 402, the first poly line 404, the second poly line 406, and the gate line 408. For example, the gate line 408, the first poly line 404, and the second poly line 406 are shown as parallel structures to each other, although it is understood that the gate line 408, the first poly line 404, and the second poly line 406 may not be parallel to each other.

As an example, the second stress formation liner 320 is shown in a rectangular shape. Also for example, the isolation region 314 is shown at a side 410 of the second stress formation liner 320, although it is understood that the isolation region 314 may be located at other locations, such as under the second stress formation liner 320, not adjacent to the second stress formation liner 320, at other sides of the second stress formation liner 320, or located at multiple locations with multiple instances.

The active area 402 may be formed in a number of sizes and shapes. For example, the active area 402 is shown in a rectangular shape having a length side 411 measured as an active length 412 denoted as "$W_{rx}$" and a width side 414 measured as an active width 416 denoted as "W", wherein the length side 411 and the width side 414 are adjacent sides. The second stress formation liner 320, as an example, extends from the length side 411 a first distance 418 denoted as "$dt_1$" and from the opposite side to the length side 411 a second distance 420 denoted as "$dt_2$". The second stress formation liner 320, as an example, extends from the width side 414 a third distance 422 denoted as "$dl_1$" and from the opposite side to the length side 411 a fourth distance 424 denoted as "$dl_2$".

Figure 5:
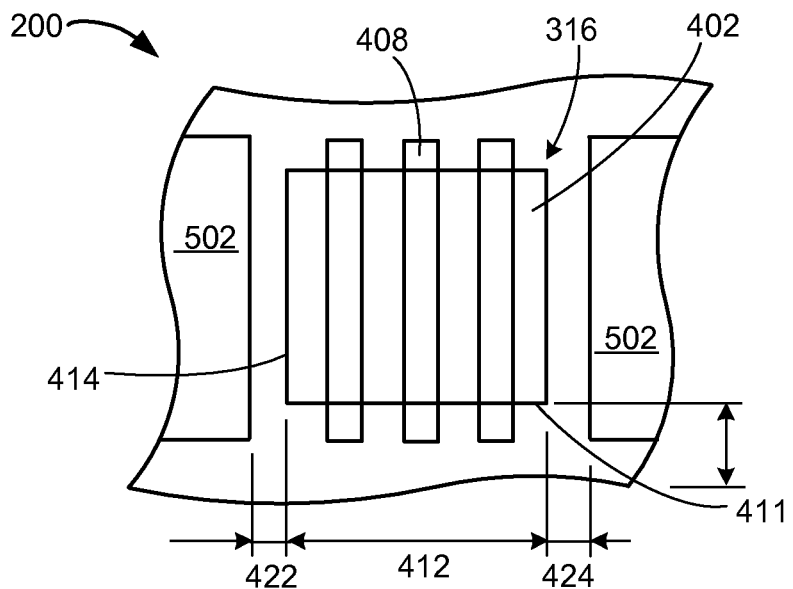
FIG. 5 is the structure of FIG. 4 for modeling parallel stress.

Referring now to FIG. 5, therein is shown the structure of FIG. 4 for modeling parallel stress. The modeling parallel stress may be included in the analysis block 103 of FIG. 1. The characterization of the integrated circuit 200 preferably gathers numerous measurements for forming accurate models of the stress contribution upon a device element such as the second circuit element 316.

Stress, denoted as "σ" at a distance "x" away from stress origin is proportional to 1/x and may be expressed generally as Equation 1:

$$\sigma(x) = \frac{k}{x} \quad (1)$$

Stress may be described with two components referred to as parallel proximity and orthogonal proximity. The parallel proximity component may be isolated by setting the first distance 418 of FIG. 4, "$dt_1$", and the second distance 420 of FIG. 4, "$dt_2$", to a sufficiently large value, for example greater than 5 μm, close to approximating the effect of an infinity value. The orthogonal proximity component may be isolated by setting the third distance 422, "$dl_1$", and the fourth distance 424, "$dl_2$", to a sufficiently large value, for example greater than 5 μm, close to approximating the effect of an infinity value. These approximations help in determining the contribution of parallel and orthogonal stress contribution to the channel mobility of the second circuit element 316.

For isolating the parallel proximity component, parallel stress sources 502, such as tensile sources, are preferably placed the third distance 422, "$dl_1$", and the fourth distance 424, "$dl_2$" from the width side 414 of the active area 402 and the opposite side of the width side 414 of the active area 402, respectively. The parallel stress sources 502 apply parallel proximity stress at the center of the second channel region 342 under the gate line 408 and may be expressed by Equation 2, based on Equation 1:

$$\sigma_{x1} = k_{x1} \left[ \left( \frac{1}{\frac{W_{rx}}{2} + dl_1} \right) + \left( \frac{1}{\frac{W_{rx}}{2} + dl_2} \right) \right] \quad (2)$$

The variable "$k_{x1}$" may be a negative or positive value.

Figure 6:
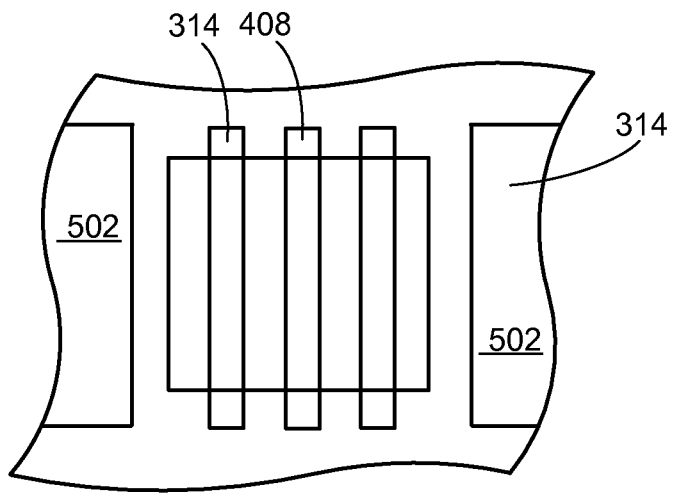
FIG. 6 is the structure of FIG. 4 for modeling of parallel stress from the isolation region.

Referring now to FIG. 6, therein is shown the structure of FIG. 4 for modeling of parallel stress from the isolation region 314. The modeling of parallel from the isolation region 314 may be included in the analysis block 103 of FIG. 1. As an example, the isolation region 314 is shown parallel to the gate line 408 resulting in the isolation region 314 contributing to the parallel proximity component.

The contribution of the isolation region 314 to the parallel proximity component may be modeled a number of ways. For example, the parallel stress sources 502 may provide tensile stress at the first distance 418 of FIG. 4 and the second distance 420 of FIG. 4 has sufficiently large values. Another example, the parallel stress sources 502 may provide neutral stress as well as setting neutral stress to both the first stress formation liner 318 of FIG. 4 and the second stress formation liner 320 of FIG. 4 for isolating the effects from the isolation region 314. The parallel proximity component from the isolation region 314 may be expressed as Equation 3 from evaluating Equation 2:

$$\sigma_{x2} = k_{x2} \left[ \left( \frac{1}{\frac{W_{rx}}{2}} \right) + \left( \frac{1}{\frac{W_{rx}}{2}} \right) \right] \quad (3)$$

$$\sigma_{x2} = k_{x2} \left( \frac{2}{\frac{W_{rx}}{2}} \right)$$

The variable "$k_{x2}$" may be a negative or positive value. The parallel proximity component including the contribution of the isolation region 314 may be expressed as Equation 4:

$$\sigma_x = \sigma_{x1} + \sigma_{x2} \quad (4)$$

Figure 7:
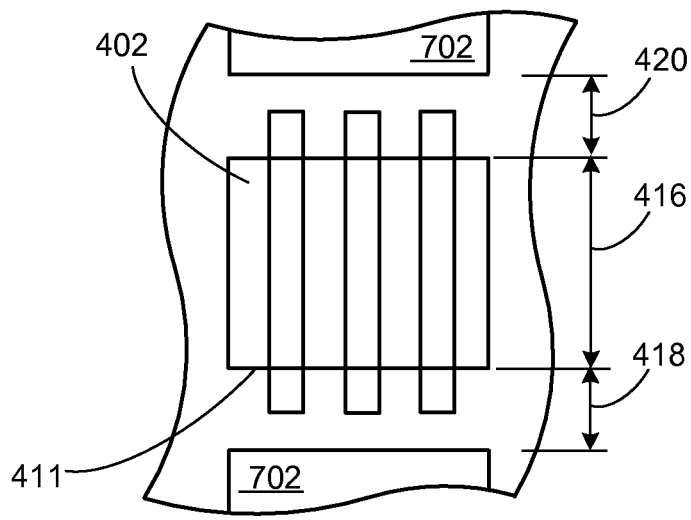
FIG. 7 is the structure of FIG. 4 for modeling orthogonal stress.

Referring now to FIG. 7, therein is shown the structure of FIG. 4 for modeling orthogonal stress. The structure from Equation 1 in FIG. 5 may be applied for orthogonal proximity component. For isolating the orthogonal proximity component, orthogonal stress sources 702, such as tensile sources, are preferably placed the first distance 418, "$dt_1$", and the second distance 420, "$dt_2$", from the length side 411 of the active area 402 and the opposite side of the length side 411 of the active area 402, respectively.

In the case of orthogonal direction, the orthogonal stress will be different at different "y" or different locations from one of the orthogonal stress sources 702. Unlike parallel proximity component, channel mobility will be enhanced or degraded differently at different values of "y" or different locations from the orthogonal stress sources 702. The orthogonal proximity component may be expressed by integrating or averaging over the active width 416, "W". The orthogonal proximity component may be expressed by Equation 5:

$$\sigma_y = k_y\left(\frac{1}{W}\right)\ln\left[\left(1+\frac{W}{dt_1}\right)\left(1+\frac{W}{dt_2}\right)\right] \quad (5)$$

The channel stress may be expressed by combining the parallel proximity components and the orthogonal proximity component as shown in Equation 6:

$$\sigma_{channel} = \sigma_x + \sigma_y = \sigma_{x1} + \sigma_{x2} + \sigma_y \quad (6)$$

Referring now to FIGS. 8A through 8E, therein are shown plan views of orthogonal test structures for modeling the orthogonal stress of the structure of FIG. 4. Often, there is not a direct method to measure this stress either due to structural or time limitations. In order to model the stress as expressed in Equation 6, the orthogonal test structures preferably provide measurement device structures for providing the necessary information to evaluate Equation 6.

For generating the compact models as expressed in Equation 6, current-voltage (I-V) measurements are made on the orthogonal test structures. These I-V measurements may be performed in the generation block 101 of FIG. 1 for gathering the measurements and in the extraction block 102 of FIG. 1 for extracting the information used to extrapolate or extract values for "$k_{x1}$", "$k_{x2}$", and "$k_y$". For orthogonal proximity component, the orthogonal test structures vary from one another by varying the value of the first distance 418, "$dt_1$", and the second distance 420, "$dt_2$" from the active area 402 with other variables fixed.

Figure 8A:
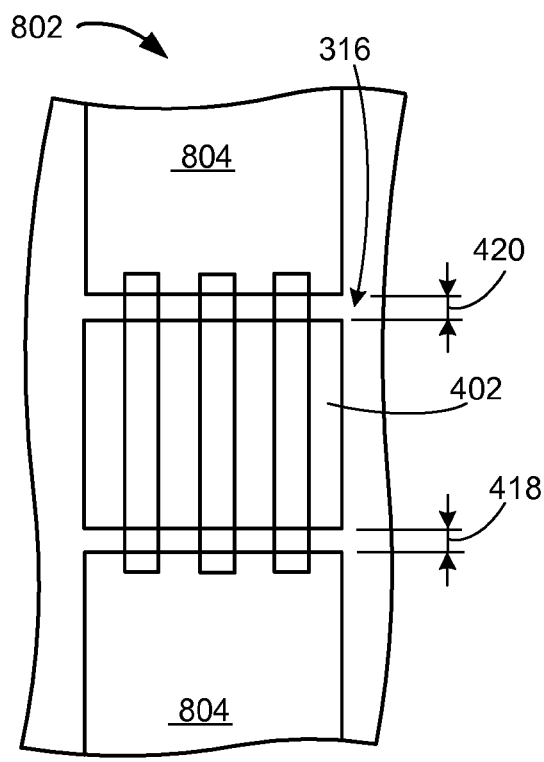
FIGS. 8A through 8E, are plan views of test structures for modeling the orthogonal stress of the structure of FIG. 4.
Figure 8B:
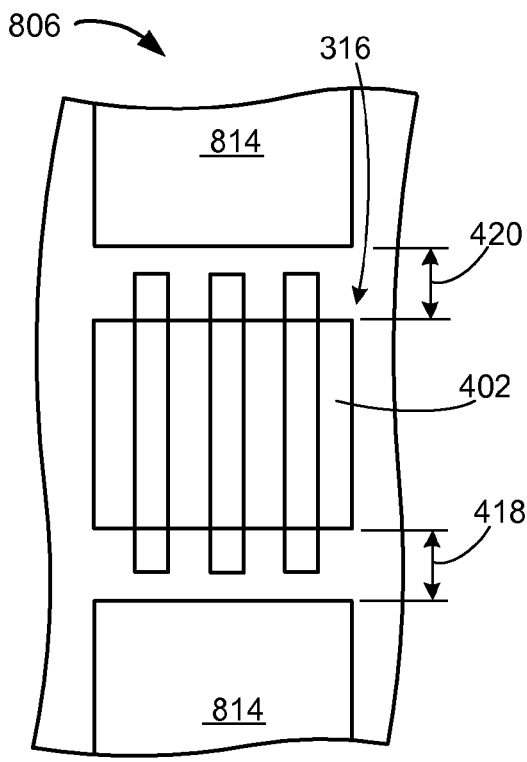
Figure 8C:
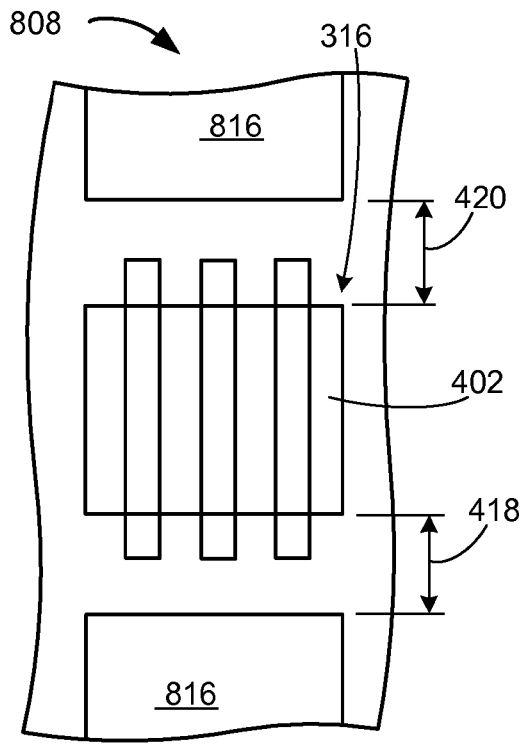
Figure 8D:
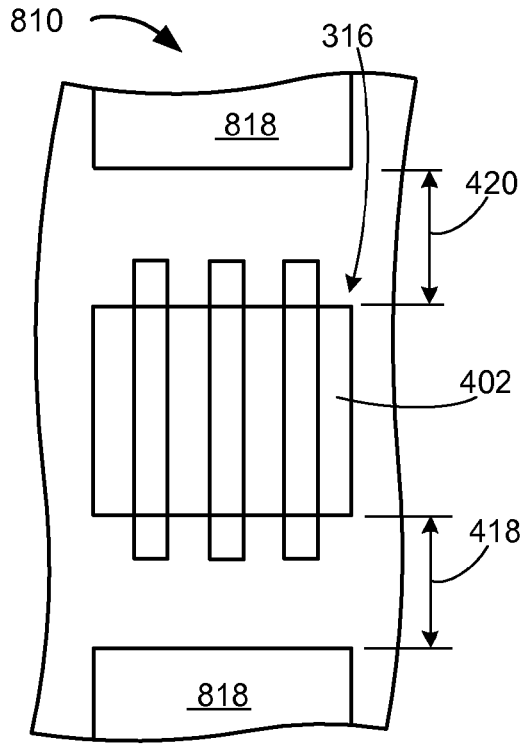

Shown in FIG. 8A, a first orthogonal test structure 802 has the device of interest or in this example the second circuit element 316 under orthogonal stress from first test orthogonal sources 804. The first test orthogonal sources 804 preferably exert tensile stress closest to the active area 402 compared to the other orthogonal test structures.

Shown in FIGS. 8B, 8C, 8D, and 8E, a second orthogonal test structure 806, a third orthogonal test structure 808, a fourth orthogonal test structure 810, and a fifth orthogonal test structure 812 preferably have second test orthogonal sources 814, third test orthogonal sources 816, fourth test orthogonal sources 818, and fifth test orthogonal sources 820, respectively, exerting tensile stress to its respective instantiation of the second circuit element 316. For illustrative purposes, five orthogonal test structures are shown for developing the orthogonal stress component, although it is understood that the number and types of orthogonal test structures may differ.

From the first orthogonal test structure 802 through the fifth orthogonal test structure 812, the value of the first distance 418, "$dt_1$", and the second distance 420, "$dt_2$" are increased. For further simplification of this example, the first distance 418 and the second distance 420 are shown as equal and denoted by "dt" with the first orthogonal test structure 802 having "dt1", the second orthogonal test structure 806 having "dt2", the third test structure having "dt3", the fourth orthogonal test structure 810 having "dt4", and the fifth orthogonal test structure 812 having "dt5".

Current ($I_{deff}$) is measured from each of the orthogonal test structures and all the measured current may be evaluated with Equation 7 in the analysis block 103:

$$I_{deff} = \left(\frac{I_{dhi} + I_{dlow}}{2}\right) \quad (7)$$

Equation 7 for the orthogonal test structures is preferably plotted as function of "dt" from each of the orthogonal test structures. The value for "dt5" of the fifth orthogonal test structure 812 is preferably sufficiently large such that Equation 5 may be evaluated as:

$$\sigma_y(dt5) \sim 0. \quad (8)$$

$I_{deff}$ is preferably measured at same $I_{off}$ which means that the enhancement/degradation at different "dt" stems from stress induced mobility change in the channel.

The fifth orthogonal test structure 812 is preferably used for normalizing the measured currents and tabulated in Table 1 below.

| Test Structure Number | $\Delta I_{deff}/I_{deff}$ |
| --- | --- |
| 1 | $(I_{deff1} - I_{deff5})/I_{deff5}$ |
| 2 | $(I_{deff2} - I_{deff5})/I_{deff5}$ |
| 3 | $(I_{deff3} - I_{deff5})/I_{deff5}$ |
| 4 | $(I_{deff4} - I_{deff5})/I_{deff5}$ |
| 5 | $(I_{deff5} - I_{deff5})/I_{deff5} = 0$ |

Figure 8E:
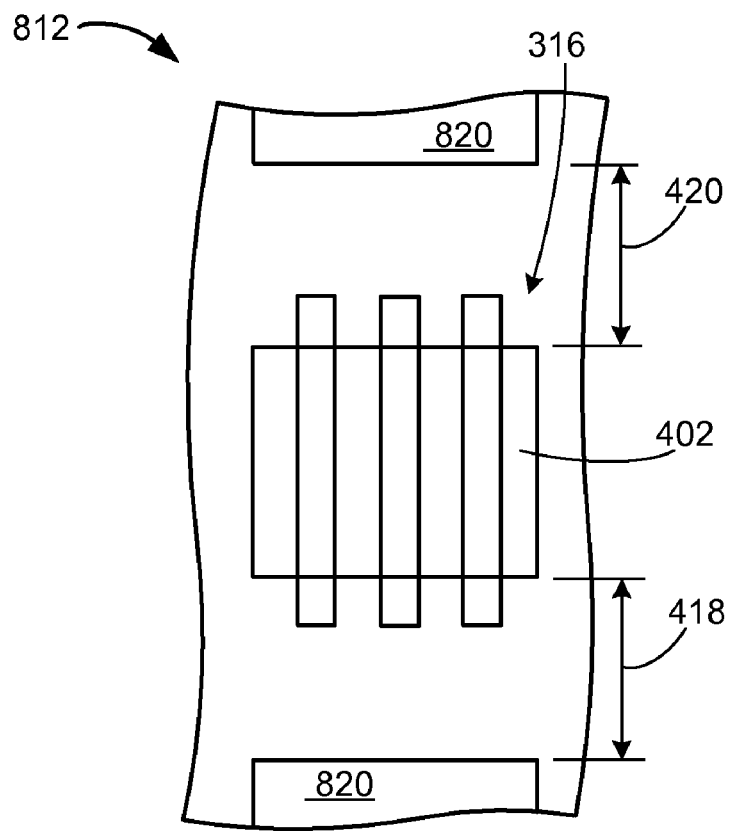
Figure 9:
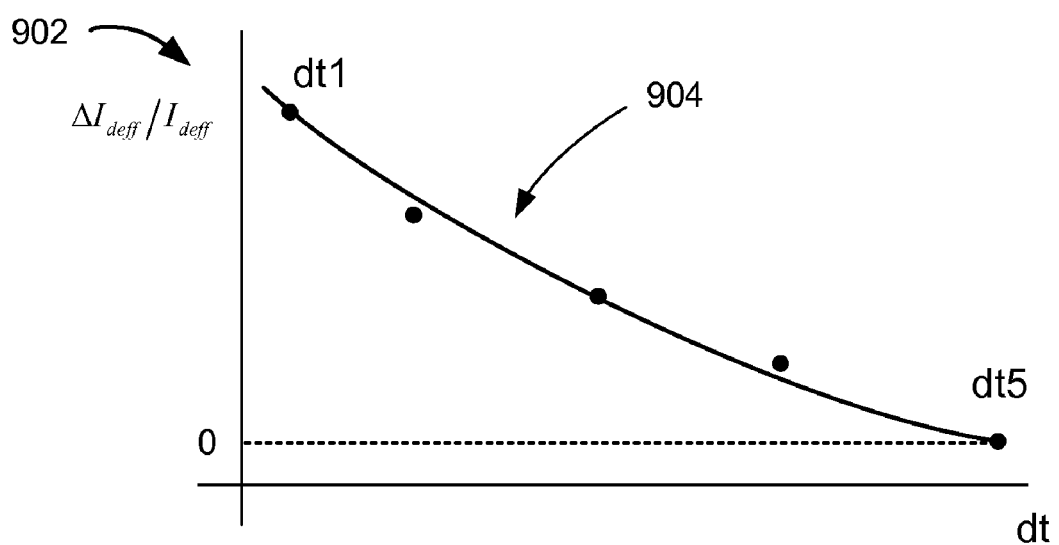
FIG. 9 is a graphical view of a normalized plot of the orthogonal test structures of FIGS. 8A through 8E.

Referring now to FIG. 9, therein is shown a graphical view of a plot 902 of the orthogonal test structures of FIG. 8A through 8E. The plot 902 may be provided by the presentation block 104 of FIG. 1. The plot 902 depicts the values from Table 1 above with a curve 904 as estimated values. The x-axis represents "dt" and the y-axis represents the normalized ratio of $\Delta I_{deff}/I_{deff}$ from the second column of Table 1.

The increase or decrease in $I_{deff}$ in the second circuit element 316 of FIG. 3, the PMOS device, or in the first circuit element 312 of FIG. 3, the NMOS device, respectively, with orthogonal distance is from the change in mobility. Hence, the increase or decrease in $I_{deff}$ normalized to $I_{deff}$ of the fifth orthogonal test structure 812 of FIG. 8E is proportional to mobility increase (decrease) normalized to mobility of the fifth orthogonal test structure 812. $\Delta I_{deff}/I_{deff5}$ is evaluated as $\sigma_y$ expressed by Equation 8.

The relationship between $\sigma_y$ and mobility is expressed by Equation 9:

$$\sigma_y = \frac{\Delta \mu_{\textit{eff}}}{\mu_{\textit{eff0}}} = \frac{\mu_{\textit{eff}} - \mu_{\textit{eff0}}}{\mu_{\textit{eff0}}} \qquad (9)$$

The mobility of each of the orthogonal test structures is denoted as $\mu_{\textit{eff}}$ and the reference test structure or the fifth test structure is denoted as $\mu_{\textit{eff0}}$. Relating Equation 9 with Equation 5, "$k_y$" may be extracted from measured currents from the orthogonal test structures and preferably used for forming the compact model in the analysis block 103 of FIG. 1.

Referring now to FIGS. 10A through 10E, therein are shown plan views of parallel test structures for modeling the parallel stress of the structure of FIG. 4. Similar to "$k_y$", "$k_{x1}$" may be preferably extracted or derived from measured current for the compact model in the analysis block 103 of FIG. 1 and the measured current may be from the extraction block 102 of FIG. 1. For parallel proximity component, the parallel test structures vary from one another by varying the value of the third distance 422, "$dl_1$", and the fourth distance 424, "$dl_2$", from the active area 402 with other variables fixed.

Figure 10A:
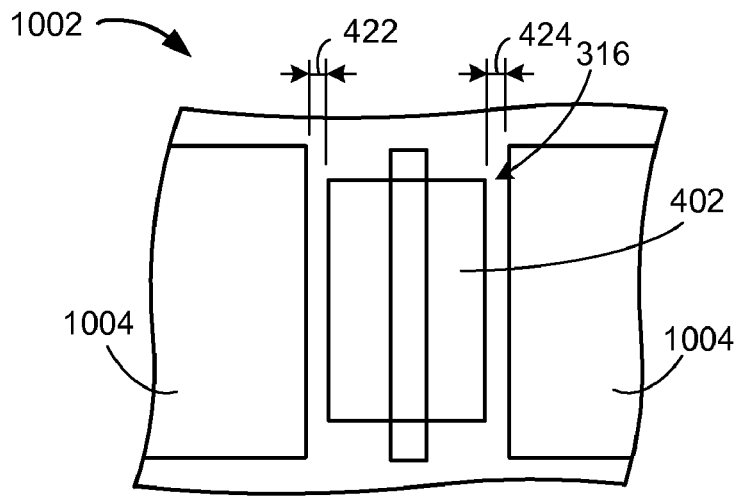
FIGS. 10A through 10E are plan views of parallel test structures for modeling the parallel stress of the structure of FIG. 4.
Figure 10B:
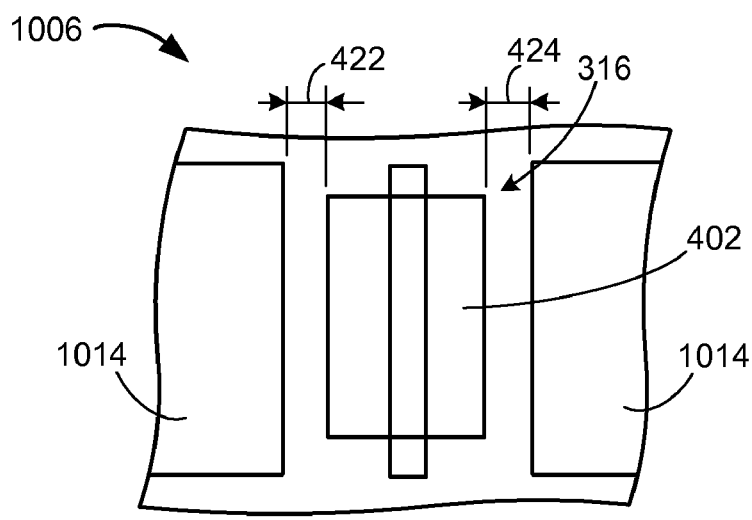
Figure 10C:
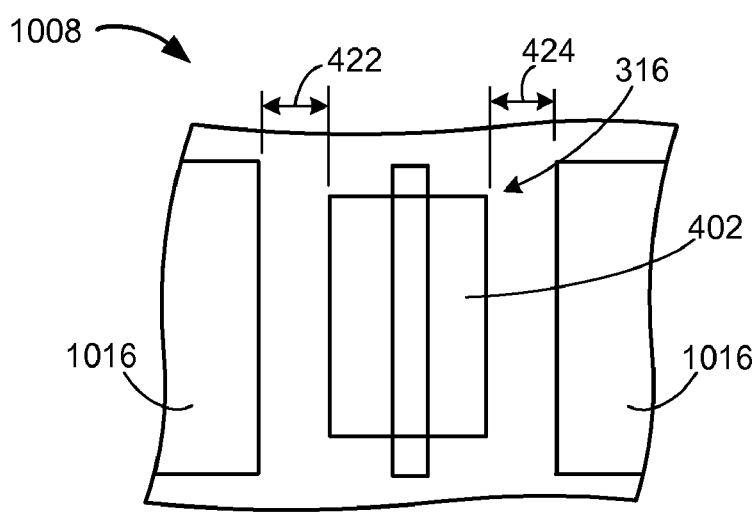
Figure 10D:
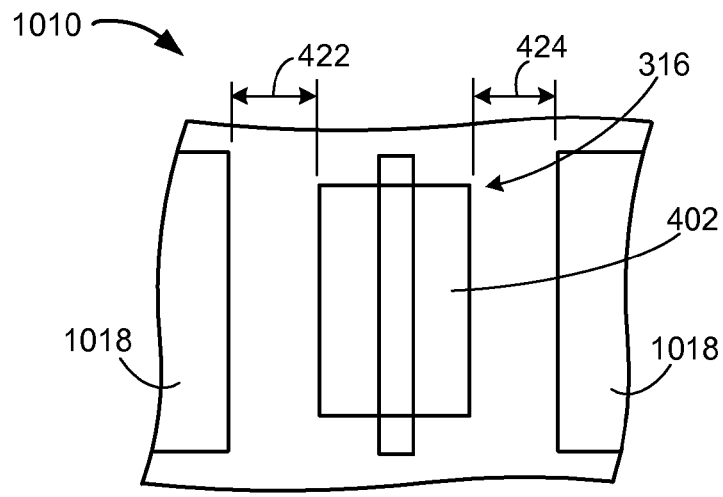
Figure 10E:
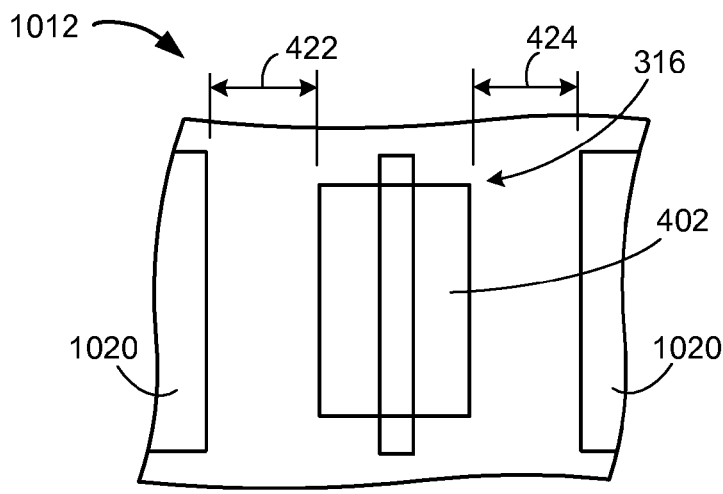

Shown in FIG. 10A, a first parallel test structure 1002 has the device of interest or in this example the second circuit element 316 under parallel stress from first test parallel sources 1004. The first test parallel sources 1004 preferably exert tensile stress closest to the active area 402 compared to the other parallel test structures for parallel stress.

Shown in FIGS. 10B, 10C, 10D, and 10E, a second parallel test structure 1006, a third parallel test structure 1008, a fourth parallel test structure 1010, and a fifth parallel test structure 1012 preferably have second test parallel sources 1014, third test parallel sources 1016, fourth test parallel sources 1018, and fifth test parallel sources 1020, respectively, exerting tensile stress to its respective instantiation of the second circuit element 316. From the first parallel test structure 1002 through the fifth parallel test structure 1012, the value of the third distance 422, "$dl_1$", and the fourth distance 424, "$dl_2$" are increased. For further simplification of this example, the third distance 422 and the fourth distance 424 are shown as equal and denoted by "dl" with the first parallel test structure 1002 having "dl1", the second parallel test structure 1006 having "dl2", the third test structure having "dl3", the fourth parallel test structure 1010 having "dl4", and the fifth parallel test structure 1012 having "dl5".

A similar process as described for the orthogonal test structures above, the fifth parallel test structure 1012 may be used to provide a normalized value and forming a similar table to Table 1 above. The process may continue similarly as for the orthogonal test structures for extracting "$k_{x1}$".

Referring now to FIGS. 11A through 11E are plan views of trench test structures for modeling the stress from the isolation region 314 of the structure of FIG. 4. Similar to "$k_y$" and "$k_{x1}$", "$k_{x2}$" may be preferably extracted or derived from measured current for the compact model in the analysis block 103 of FIG. 1 and the measured current is preferably from the extraction block 102 of FIG. 1. For parallel proximity component from the isolation region 314 of FIG. 3, the trench test structures vary from one another by varying the value of the active length 412 of FIG. 3, "$W_{rx}$", of the active area 402 of FIG. 3 of the second circuit element 316 of FIG. 3 with other variables fixed.

Figure 11A:
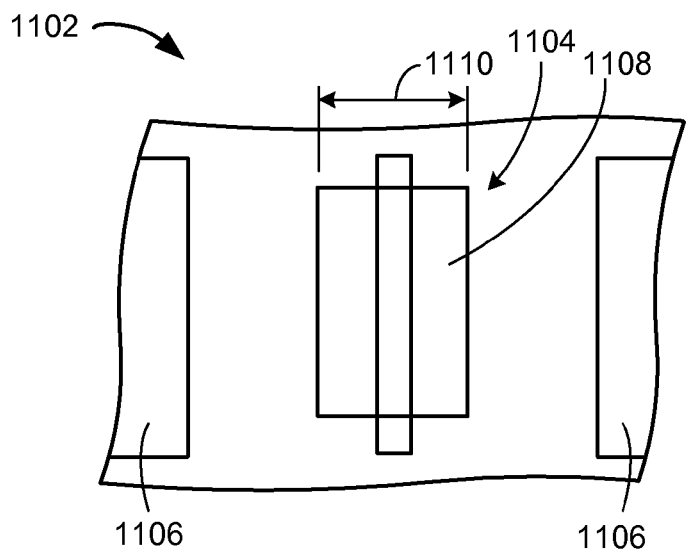
FIGS. 11A through 11E are plan views of trench test structures for modeling the stress from the isolation region of the structure of FIG. 4.
Figure 11B:
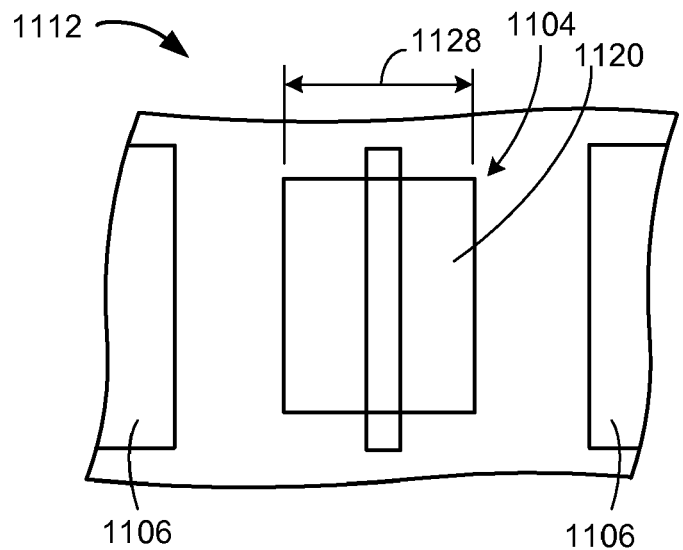
Figure 11C:
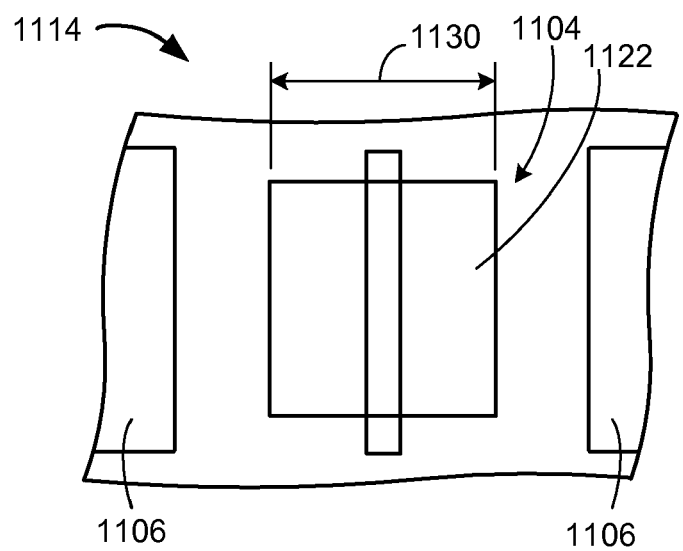
Figure 11D:
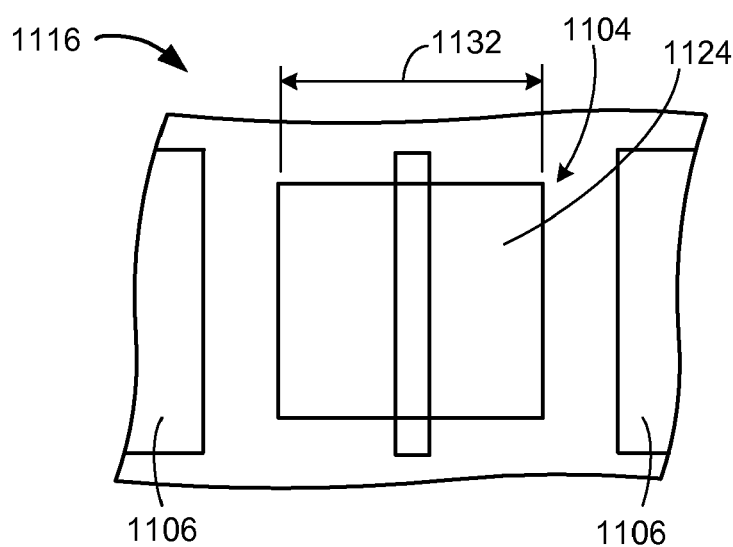
Figure 11E:
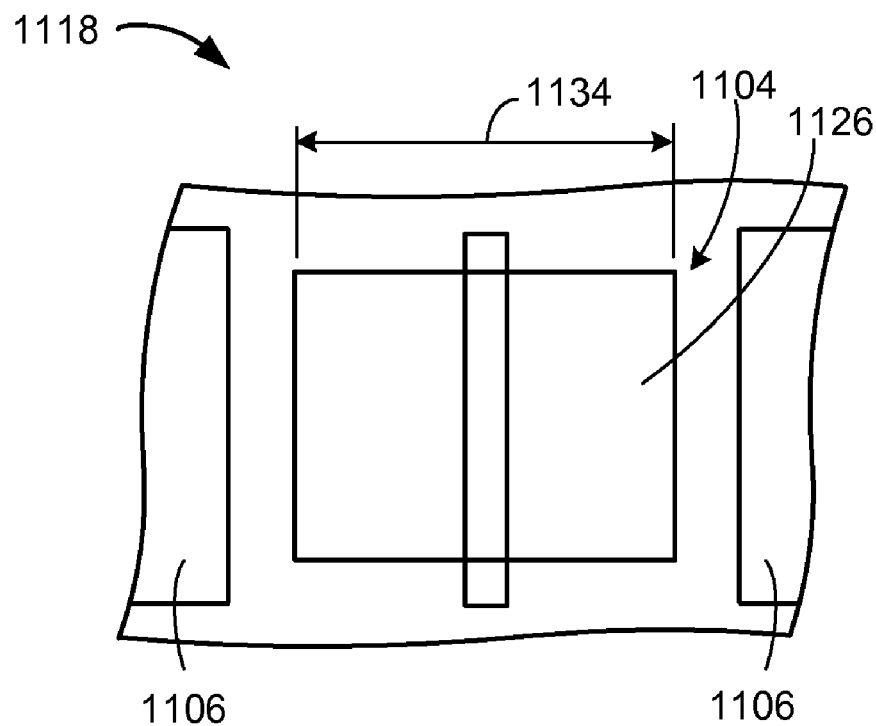

Shown in FIG. 11A, a first trench test structure 1102 has the device of interest or in this example a first test circuit element 1104 under parallel stress from trench parallel sources 1106. The first test circuit element 1104 has a first active area 1108 with a first active length 1110 denoted as "$W_{rx1}$". The first test circuit element 1104 is similar to the second circuit element 316 with both having compressive stress over the first active area 1108 and the active area 402, respectively. The first trench test structure 1102 has the first active area 1108 furthest from the trench parallel sources 1106 compared with the other trench test structures, wherein the trench parallel sources 1106 preferably exert tensile stress to the first active area 1108.

Shown in FIGS. 11B, 11C, 11D, and 11E, a second trench test structure 1112, a third trench test structure 1114, a fourth trench test structure 1116, and a fifth trench test structure 1118 preferably have a second active area 1120, a third active area 1122, a fourth active area 1124, and a fifth active area 1126, respectively, with the trench parallel sources 1106 exerting tensile stress to its respective active area.

The second active area 1120 includes a second active length 1128 denoted as "$W_{rx2}$" with the second active length 1128 greater than the first active length 1110. The third active area 1122 includes a third active length 1130 denoted as "$W_{rx3}$" with the third active length 1130 greater than the second active length 1128. The fourth active area 1124 includes a fourth active length 1132 denoted as "$W_{rx4}$" with the fourth active length 1132 greater than the third active length 1130. The fifth active area 1126 includes a fifth active length 1134 denoted as "$W_{rx5}$" with the fifth active length 1134 greater than the fourth active length 1132.

From the first trench test structure 1102 through the fifth trench test structure 1118, the values of the active length of the active areas are increased. A similar process as described for the orthogonal test structures above, the fifth trench test structure 1118 may be used to provide a normalized value and forming a similar table to Table 1 above.

For the purpose of compact modeling, the device of interest (DOI) or the second circuit element 316 with fixed proximities, "$W_{rx}$", "W", etc. The mobility ($\mu_0$) for this particular device, referred to as a reference device, will be extracted based on I-V characteristics. The other proximity affects mobility. For example, the reference device has proximity parameters "$dt_0$", "$dl_0$", "$W_0$", and "$W_{rx0}$". The device of interest has proximity parameters "dt", "dl", "W", and "$W_{rx}$".

The stress in a reference device or reference structure may be expressed as Equation 10:

$$\sigma_0 = \sigma_{x0} + \sigma_{y0} \qquad (10)$$

The stress for a device of interest may be expressed in Equation 11:

$$\sigma = \sigma_x + \sigma_y \qquad (11)$$

The mobility for the device of interest may be expressed in Equation 12:

$$\frac{\sigma}{\sigma_0} \cdot \mu_0 \qquad (12)$$

Figures 12A, 12B, 12C:
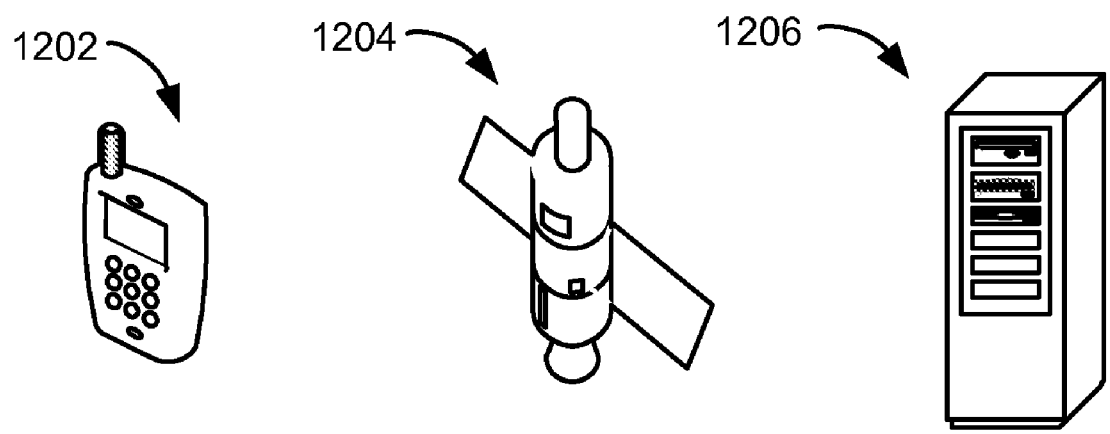
FIGS. 12A, 12B, and 12C are schematic views of examples of electronics systems in which various aspects of the present invention may be implemented.

Referring now to FIGS. 12A, 12B, and 12C, therein are shown schematic views of examples of electronics systems in which various aspects of the present invention may be implemented. A smart phone 1202, a satellite 1204, and a computer system 1206 are examples of the electronic systems using the present invention. The electronic systems may be any system that performs any function for the creation, transportation, storage, and consumption of information. For example, the smart phone 1202 may create information by transmitting voice to the satellite 1204. The satellite 1204 is used to transport the information to the computer system 1206. The computer system 1206 may be used to store the information. The smart phone 1202 may also consume information sent from the satellite 1204.

The electronic systems, such as the smart phone 1202, the satellite 1204, and the computer system 1206, include a one or more subsystem, such as a printed circuit board having the present invention or an electronic assembly having the present invention. The electronic system may also include a subsystem, such as an adapter card.

Figure 13:
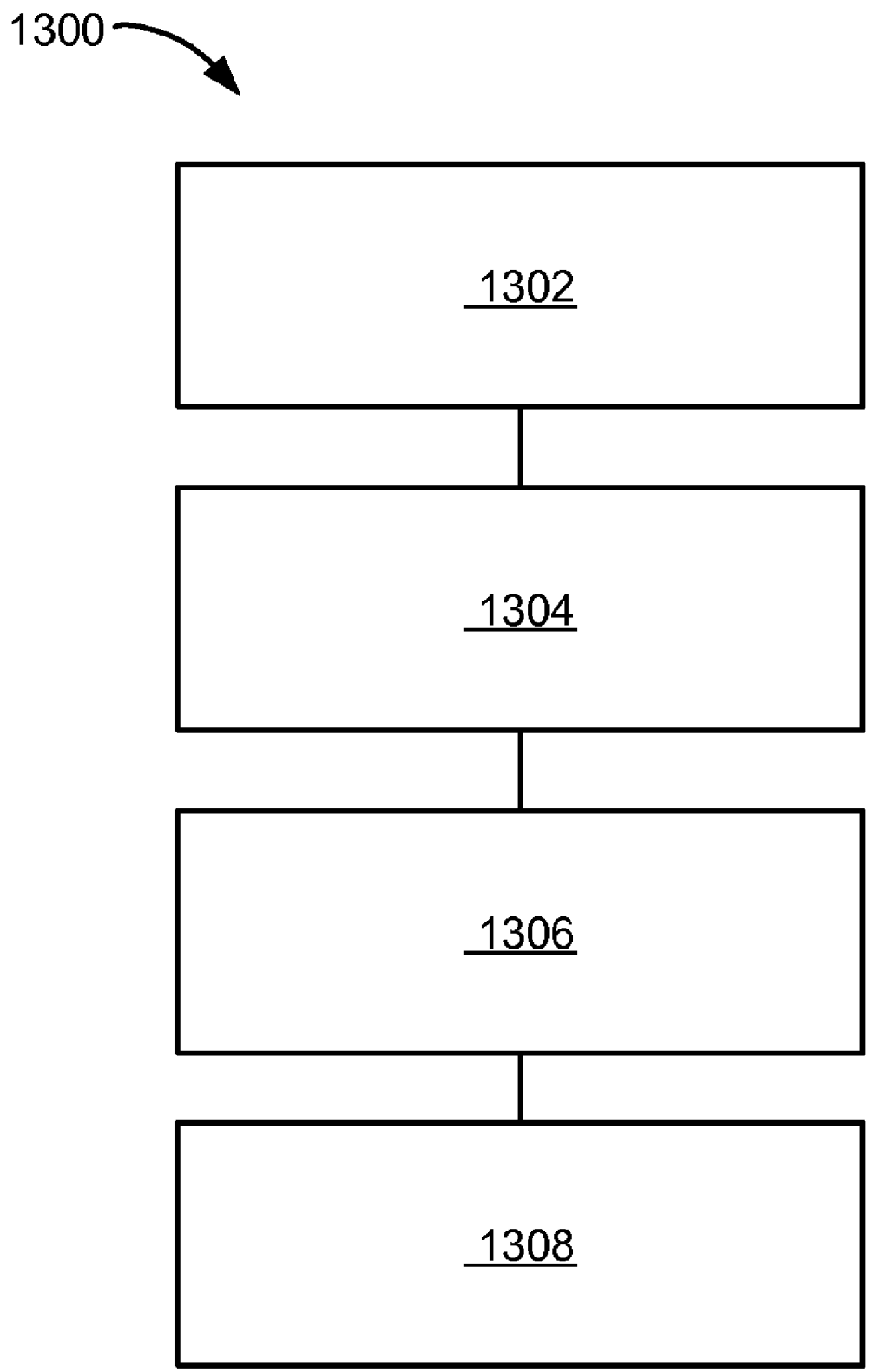
FIG. 13 is a flow chart of for a method of operating an integrated circuit tester information processing system for modeling of the integrated circuit in an embodiment of the present invention.

Referring now to FIG. 13, therein is shown a flow chart of for a method 1300 of operating the integrated circuit tester information processing system 100 for modeling of the integrated circuit 200 in an embodiment of the present invention. The method 1300 includes measuring current information from test structures for an integrated circuit having dual stress liners in a block 1302; selecting currents from the current information or stored current information in a block 1304; deriving a scaling factor with the currents for a stress contribution based on an active area of a circuit element in the integrated circuit in a block 1306; and correlating the stress contribution with the integrated circuit in a block 1308.

These and other valuable aspects of the present invention consequently further the state of the technology to at least the next level.

Thus, it has been discovered that the integrated circuit tester information processing system method and apparatus of the present invention furnish important and heretofore unknown and unavailable solutions, capabilities, and functional aspects for memory systems. The resulting processes and configurations are straightforward, cost-effective, uncomplicated, highly versatile, accurate, sensitive, and effective, and can be implemented by adapting known components for ready, efficient, and economical manufacturing, application, and utilization.

The resulting processes and configurations are straightforward, cost-effective, uncomplicated, highly versatile and effective, can be implemented by adapting known technologies, and are thus readily suited for efficiently and economically manufacturing memory systems.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for operating an integrated circuit tester information processing system comprising:
    measuring current information from test structures for an integrated circuit having dual stress liners;
    selecting currents from the current information or stored current information;
    deriving a scaling factor with the currents for a stress contribution based on an active area of a circuit element in the integrated circuit; and
    correlating the stress contribution with the integrated circuit.

2. The method as claimed in claim 1 wherein measuring current information from the test structures includes measuring each of the test structures for a drain current high ($I_{dhigh}$) and a drain current low ($I_{dlow}$).

3. The method as claimed in claim 1 wherein deriving the scaling factor with the currents for the stress contribution based on the active area of the circuit element in the integrated circuit includes:
    calculating an effective drain current ($I_{deff}$) for each of the test structures with a drain current high ($I_{dhigh}$) and a drain current low ($I_{dlow}$) from each of the test structures;
    providing an equation for a stress component with a distance between the active area and a stress liner of the dual stress liners;
    relating a change in the effective drain current to a change of mobility in the circuit element;
    relating the equation and the change to mobility for deriving the scaling factor; and further comprising:
    developing a compact model for the integrated circuit with the scaling factor; and
    manufacturing an electronic system with the integrated circuit manufactured with an application of the compact model.

4. The method as claimed in claim 1 wherein measuring current information from the test structures includes measuring a drain current high ($I_{dhigh}$) and a drain current low ($I_{dlow}$) from a parallel test structure and an orthogonal test structure.

5. The method as claimed in claim 1 wherein deriving the scaling factor with the currents for the stress contribution based on the active area of the circuit element in the integrated circuit includes developing a parallel proximity scaling factor ($k_x$) and an orthogonal proximity scaling factor ($k_y$).

6. A method for operating an integrated circuit tester information processing system comprising:
    measuring current information from test structures for an integrated circuit having dual stress liners with the test structures including parallel test structures and orthogonal test structures;
    selecting a drain current high ($I_{dhigh}$) and a drain current low ($I_{dlow}$) for each of the test structures from the current information or stored current information;
    deriving a parallel proximity scaling factor ($k_{x1}$) and an orthogonal proximity scaling factor ($k_y$) for a stress contribution based on an active area of a circuit element in the integrated circuit with the drain current high ($I_{dhigh}$) and the drain current low ($I_{dlow}$) for each of the test structures including:
        calculating an effective drain current ($I_{deff}$) for each of the test structures with the drain current high ($I_{dhigh}$) and the drain current low ($I_{dlow}$),
        providing an equation for a stress component with a distance between the active area and a stress liner of the dual stress liners,
        relating a change in the effective drain current to a change of mobility in the circuit element, and
        relating the equation and the change to mobility for deriving the scaling factor; and
    correlating the stress contribution with the integrated circuit.

7. The method as claimed in claim 6 wherein deriving the parallel proximity scaling factor ($k_{x1}$) and the orthogonal proximity scaling factor ($k_y$) for the stress contribution based on the active area includes:
    deriving the parallel proximity scaling factor ($k_{x1}$) with an active length of a length side of the active area and the distance between a width side to an end of the stress liner; and
    deriving the orthogonal proximity scaling factor ($k_y$) with an active width of a width side of the active area and a further distance between the length side to an adjacent end of the stress liner.

8. The method as claimed in claim 6 wherein providing the equation for the stress component with the distance between the active area and the stress liner of the dual stress liners includes:
   providing a parallal proximity stress component ($\sigma_x$) with the parallel proximity scaling factor ($k_{x1}$); and
   providing a parallal proximity stress component ($\sigma_y$) with the parallel proximity scaling factor ($k_y$).

9. The method as claimed in claim 6 wherein:
   measuring the current information from the test structures includes:
     measuring the current information from trench test structures; further comprising:
      deriving a trench scaling factor ($k_{x2}$); and
      providing a parallal proximity stress component ($\sigma_x$) with the parallel proximity scaling factor ($k_{x1}$) and the trench scaling factor ($k_{x2}$).

10. The method as claimed in claim 6 wherein correlating the stress contribution with the integrated circuit includes developing a model for estimating mobility of the integrated circuit with the parallel proximity scaling factor ($k_{x1}$) and the orthogonal proximity scaling factor ($k_y$).

11. An integrated circuit tester information processing system comprising:
   measurement circuitry for measuring current information from test structures for an integrated circuit having dual stress liners;
   extraction circuitry for selecting currents from the current information or stored current information;
   analysis circuitry for deriving a scaling factor with the currents for a stress contribution based on an active area of a circuit element in the integrated circuit; and
   presentation circuitry for correlating the stress contribution with the integrated circuit.

12. The system as claimed in claim 11 wherein the measurement circuitry is for measuring each of the test structures for a drain current high ($I_{dhigh}$) and a drain current low ($I_{dlow}$).

13. The system as claimed in claim 11 wherein the analysis circuitry is for:
   calculating an effective drain current ($I_{deff}$) for each of the test structures with a drain current high ($I_{dhigh}$) and a drain current low ($I_{dlow}$) from each of the test structures;
   providing an equation for a stress component with a distance between the active area and a stress liner of the dual stress liners;
   relating a change in the effective drain current to a change of mobility in the circuit element;
   relating the equation and the change to mobility for deriving the scaling factor; and
   developing a compact model for the integrated circuit with the scaling factor.

14. The system as claimed in claim 11 wherein the measurement circuitry is for measuring a drain current high ($I_{dhigh}$) and a drain current low ($I_{dlow}$) from a parallel test structure and an orthogonal test structure.

15. The system as claimed in claim 11 wherein the analysis circuitry is for developing a parallel proximity scaling factor ($k_x$) and an orthogonal proximity scaling factor ($k_y$).

16. The system as claimed in claim 11 wherein:
   the measurement circuitry is for measuring current information from parallel test structures and orthogonal test structures;
   the extraction circuitry is for selecting a drain current high ($I_{dhigh}$) and a drain current low ($I_{dlow}$) for each of the test structures from the current information or stored current information;
   the analysis circuitry is for deriving a parallel proximity scaling factor ($k_{x1}$) and an orthogonal proximity scaling factor ($k_y$) for a stress contribution based on the active area of a circuit element in the integrated circuit with the drain current high ($I_{dhigh}$) and the drain current low ($I_{dlow}$) for each of the test structures including:
     calculating an effective drain current ($I_{deff}$) for each of the test structures with the drain current high ($I_{dhigh}$) and the drain current low ($I_{dlow}$),
     providing an equation for a stress component with a distance between the active area and a stress liner of the dual stress liners,
     relating a change in the effective drain current to a change of mobility in the circuit element, and
     relating the equation and the change to mobility for deriving the scaling factor.

17. The system as claimed in claim 16 wherein the analysis circuitry is for:
   deriving the parallel proximity scaling factor ($k_{x1}$) with an active length of a length side of the active area and the distance between the width side to an end of the stress liner; and
   deriving the orthogonal proximity scaling factor ($k_y$) with an active width of a width side of the active area and a further distance between the length side to an adjacent end of the stress liner.

18. The system as claimed in claim 16 wherein the analysis circuitry is for:
   deriving a parallal proximity stress component ($\sigma_x$) with the parallel proximity scaling factor ($k_{x1}$); and
   deriving a parallal proximity stress component ($\sigma_y$) with the parallel proximity scaling factor ($k_y$).

19. The system as claimed in claim 16 wherein:
   the measurement circuitry is for:
     measuring the current information from trench test structures; the analysis circuitry is for:
     deriving a trench scaling factor ($k_{x2}$); and
     providing a parallal proximity stress component ($\sigma_x$) with the parallel proximity scaling factor ($k_{x1}$) and the trench scaling factor ($k_{x2}$).

20. The system as claimed in claim 16 wherein the presentation circuitry is for developing a model for estimating mobility of the integrated circuit with the parallel proximity scaling factor ($k_{x1}$) and the orthogonal proximity scaling factor ($k_y$).

* * * * *